United States Patent
Lin

(10) Patent No.: US 8,573,063 B2
(45) Date of Patent: Nov. 5, 2013

(54) HEIGHT ADJUSTMENT STRUCTURE OF PRINTED CIRCUIT BOARD AND HEIGHT ADJUSTMENT METHOD THEREOF

(75) Inventor: Tzu-Chih Lin, Qionglin Township (TW)

(73) Assignee: Altek Corporation, Hsinchu (TW)

( * ) Notice: Subject to any disclaimer, the term of this patent is extended or adjusted under 35 U.S.C. 154(b) by 424 days.

(21) Appl. No.: 13/111,566

(22) Filed: May 19, 2011

(65) Prior Publication Data

US 2012/0167696 A1 Jul. 5, 2012

(30) Foreign Application Priority Data

Dec. 31, 2010 (TW) ................................ 99147424 A

(51) Int. Cl.
*G01N 3/20* (2006.01)
(52) U.S. Cl.
USPC ......................................................... 73/849
(58) Field of Classification Search
USPC ......................................................... 73/849
See application file for complete search history.

(56) References Cited

U.S. PATENT DOCUMENTS

| | | | | |
|---|---|---|---|---|
| 5,825,635 A * | 10/1998 | Mukoyama et al. | .......... | 361/826 |
| 6,215,667 B1 * | 4/2001 | Ady et al. | ...................... | 361/752 |
| 6,785,150 B1 * | 8/2004 | Szilagi et al. | .................. | 361/810 |
| 8,193,453 B2 * | 6/2012 | Hasegawa et al. | ............ | 174/255 |

* cited by examiner

*Primary Examiner* — Lisa Caputo
*Assistant Examiner* — Octavia Davis-Hollington
(74) *Attorney, Agent, or Firm* — Wang Law Firm, Inc.; Li K. Wang; Stephen Hsu

(57) ABSTRACT

A height adjustment structure of printed circuit board and the adjustment method thereof are disclosed. The height adjustment structure includes an electronic device main body, a circuit board body and an adjusting component. The electronic device main body includes at least one fixing part. The circuit board body is disposed on a surface of the electronic device main body at which the fixing part is located. The circuit board body includes at least one stuck part, wherein the stuck part is disposed along the edge of the circuit board body and corresponds to the fixing part; further, the stuck part recesses inwards into the circuit board body to form a U shape. One end of the adjusting component movably penetrates the fixing part and being screw locked thereon, and another end of the adjusting component is embedded to the stuck part.

10 Claims, 6 Drawing Sheets

HEIGHT ADJUSTMENT STRUCTURE OF PRINTED CIRCUIT BOARD AND HEIGHT ADJUSTMENT METHOD THEREOF

BACKGROUND OF THE INVENTION

1. Field of the Invention

The present invention relates to a printed circuit board adjustment structure, and more particularly to a height adjustment structure of printed circuit board and the adjustment method thereof that are capable of adjusting the relative height of the printed circuit board to an electronic device in order to prevent board warpage.

2. Brief Description of the Related Art

Electronic image pickup device is commonly used nowadays and the manufacturing and assembling technologies thereof are well developed. However, even with advanced component manufacturing technology, tolerance is still generated during the lens manufacturing process and thus causes optical error. To solve the foregoing problem, manufacturers adjust the position of lens when assembling the lens by altering the distance between the lens and electronic device main body, and the problem of the optical error is therefore fixed.

Still, another issue arises when the position of lens is adjusted to solve the optical error problem. When the lens presses the printed circuit board, printed circuit board warpage will happen and further affects the solder strength thereon and lowers the signals and circuit transmission quality.

In common fixing structure of the printed circuit board, a plurality of through holes is disposed on the printed circuit board, and screws are provided thereof to penetrate the through holes and to be fixedly locked to locking holes on the electronic device. This structure allows the printed circuit board to be pressed and secured by the screw nut and is therefore fixedly joined to the electronic device. Hence, as the printed circuit board warps, the assembler often rotates the screws to change the relative position of the screws and the locking holes to provide a space to allow curvature adjustment of the printed circuit board and thereby compensates the warpage thereon.

However, since the printed circuit board is disposed between the screw nut and the locking hole, the existing screw structure can only adjust the printed circuit board in a single direction. As the screw is rotated to move towards the locking hole, the printed circuit board is pressed by the screw nut to move towards the same direction. However, as the screw is rotated to move away from the locking hole, the screw nut cannot drive the printed circuit board to move along the same direction, and manual adjustment is required to move the printed circuit board. It causes inconvenience and inaccuracy in the assembling process of the printed circuit board and lens; further, the foregoing problem could also cause damage to the printed circuit board.

SUMMARY OF THE INVENTION

In order to overcome the deficiencies of the prior art, a primary object of the present invention is to provide a height adjustment structure of printed circuit board and the adjustment method thereof that are capable of adjusting the height of the printed circuit board to solve the problem that during the assembling of the lenses in an electronic device, the printed circuit board is pressed and thereby causes the board warpage and further damages the solder strength thereon. The present invention further simplifies the adjustment method for the printed circuit board.

With the above object in mind, the present invention provides a height adjustment structure of printed circuit board for adjusting the height of the printed circuit board in order to prevent warpage thereon. The height adjustment structure comprises an electronic device main body, a circuit board body and an adjusting component. The electronic device main body comprises at least one fixing part. The circuit board body is disposed on one surface of the electronic device main body at which the fixing part is located. The circuit board body comprises at least one stuck part, wherein the stuck part is disposed along the edge of the circuit board body and corresponds to the fixing part. Further, the stuck part recesses inwards into the circuit board body to form a U shape. One end of the adjusting component movably penetrates the fixing part and is screw locked thereon, and another end of the adjusting component is embedded to the stuck part.

Preferably, the circuit board body further comprises a first through hole, and the electronic device main body has at least one locking hole corresponding to the first through hole thereof. One end of a fixing component is wedged at the outer edge of the first through hole, and another end of the fixing component penetrates the first through hole and is screw locked to the locking hole to fixedly join the circuit board body to the electronic device main body.

Preferably, the adjusting component comprises a locking component and a position limiting part, wherein the locking component may have a cylinder shape and threads externally disposed thereon. The position limiting part is disposed at one end of the locking component and comprises a first position limiting component, a retaining component and a second position limiting component. One surface of the first position limiting component is connected to one end of the locking component; and the other end of the first position limiting component is joined to one end of the retaining component. The retaining component has a cylinder shape and is arranged in a coaxial disposition with the locking component, wherein the external diameter of the retaining component is designed to be equal to or smaller than the internal diameter of the stuck part to allow the retaining component to lodge in the stuck part. The second position limiting component is disposed at the other end of the retaining component and corresponds to the first position limiting component. The first position limiting component is of a board shape and has an external diameter larger than the internal diameter of the stuck part. The second position limiting component is of a board shape and has an external diameter larger than the internal diameter of the stuck part. As the position limiting part of the adjusting component being embedded to the stuck part, the first position limiting component and the second position limiting component are located on the circuit board body adjacent to the upper and lower surface at the edge of the stuck part respectively.

Preferably, the fixing part comprises a second through hole. The locking component penetrates the second through hole and being screw locked thereon to allow the said threads to be embedded to the inner wall of the second through hole. Moreover, as the locking component is screw locked to the second through hole, the adjusting component drives an end of the circuit board body having the position limiting part to bend in a direction corresponding to the screw lock direction of the locking component.

With the above object in mind, the present invention further provides a printed circuit board height adjustment method for the foregoing height adjustment structure, wherein the height adjustment method comprises steps described hereinafter:

calculating the bending force of the circuit board body and setting a predetermined torsion force according to the bending force;

fastening one end of the fixing component to the first through hole by rotating the fixing component with the predetermined torsion force;

determining if the bending direction of the circuit board body is towards the direction opposite to the electronic device main body, and if yes, fastening the adjusting component to the fixing part; and applying adhesive dripping technology to the joint of the fixing part and the adjusting component to adhesively join the adjusting component to the fixing part.

Preferably, within the step of determining if the bending direction of the circuit board body is towards the direction opposite to the electronic device main body, when the determined result is no, fastening the adjusting component to the fixing part and then reversely rotating the adjusting component with half the predetermined torsion force to drive part of the adjusting component to move out from the fixing part; and then applying adhesive dripping technology to the joint of the fixing part and the adjusting component to adhesively join the adjusting component to the fixing part.

As the foregoing, the height adjustment structure of printed circuit board and the adjustment method thereof according to the present invention have the following advantages:

(1) The height adjustment structure of the printed circuit board provides the U-shape stuck part along the edge of the circuit board body, and has the adjusting component embedded thereof; wherein one end of the circuit board body is joined to the electronic device main body by the fixing component, and the other end of the circuit board body is capable of adjusting the height thereof with the adjusting component. As the adjusting component is rotated to move towards the fixing part, the circuit board body is limited by the position limiting part and therefore being pressed towards the fixing part; and as the adjusting component is rotated reversely to drive part of the adjusting component to move out from the fixing part, the circuit board body is also limited by the position limiting part and therefore bends towards the direction opposite to the fixing part. By the foregoing arrangement, manual adjustment is not required; the adjustment of the printed circuit board can be done by the use of the adjusting component, and thereby simplifies the adjustment method for the printed circuit board.

(2) The printed circuit board height adjustment method calculates the bending force of the circuit board body at the beginning of the assembling process in order to set and control the torsion force applied to the fixing component and the adjusting component. This prevents the circuit board body from over-bending when it is screw locked and compensates the deformation of the printed circuit board during lenses assembling, thereby solving the problem of printed circuit board warpage and preventing damage to the solder strength thereon.

BRIEF DESCRIPTION OF THE INVENTION

The detail structure, the applied principle, the function and the effectiveness of the present invention can be more fully understood with reference to the following description and accompanying drawings, in which.

DETAILED DESCRIPTION OF THE PREFERRED EMBODIMENTS

Figure 1:
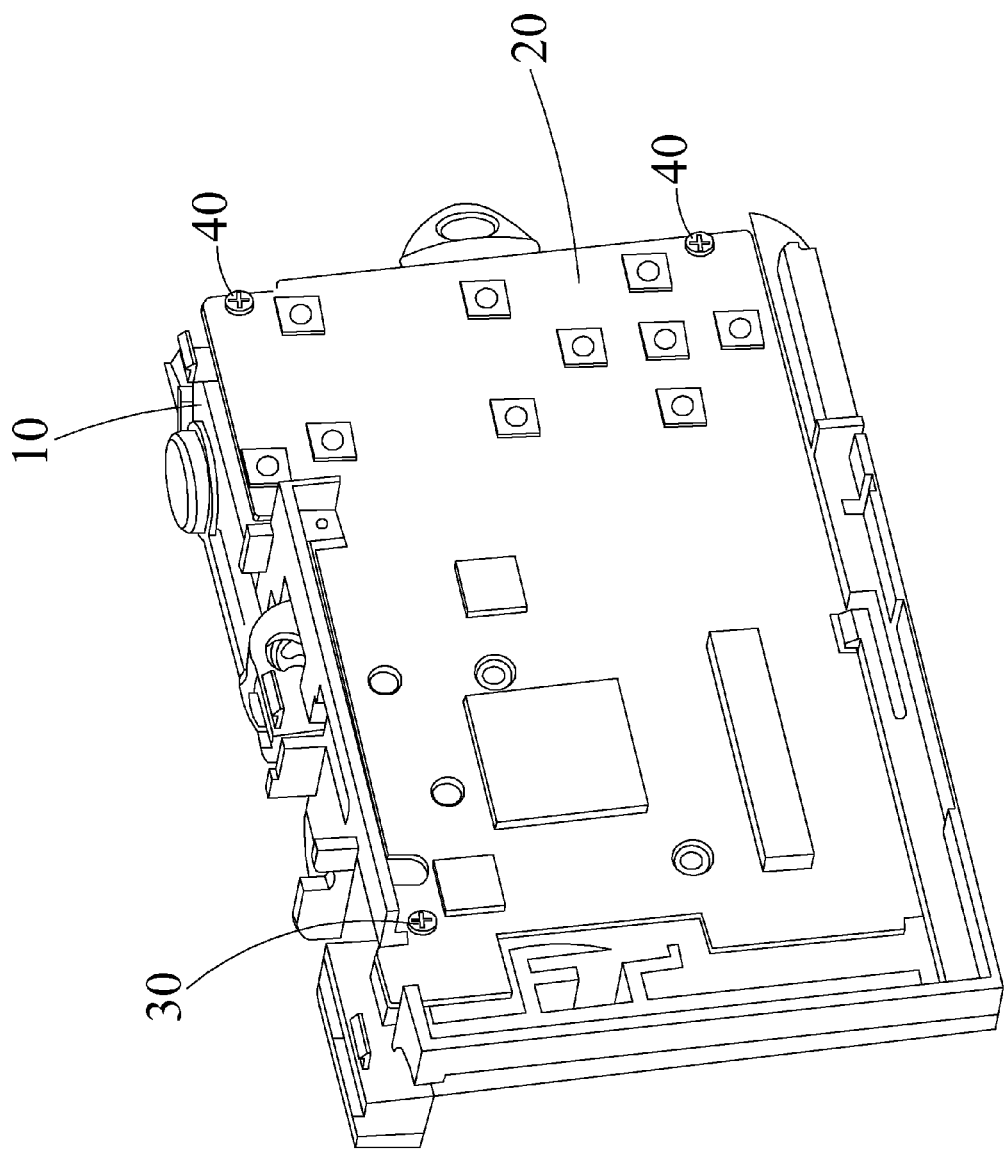
FIG. 1 is a first schematic representation of the height adjustment structure of printed circuit board according to the present invention.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

Figure 2:
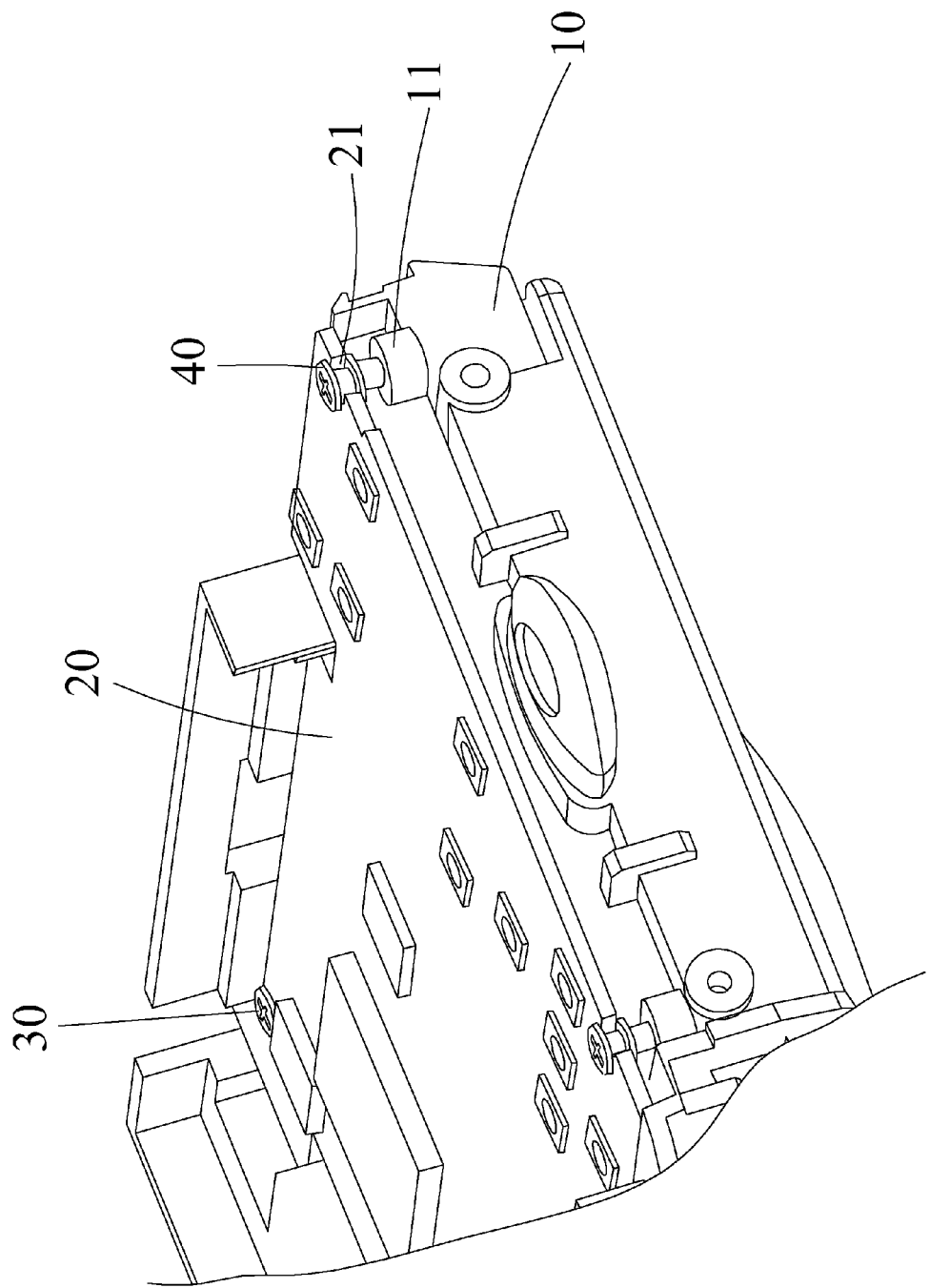
FIG. 2 is a second schematic representation of the height adjustment structure of printed circuit board according to the present invention.

With reference to FIGS. 1 and 2, which are respectively a first schematic representation and a second schematic representation of the height adjustment structure of printed circuit board according to the present invention, wherein the height adjustment structure of printed circuit board according to the present invention comprises an electronic device main body 10, a circuit board body 20, a fixing component 30 and an adjusting component 40. The circuit board body 20 comprises a first through hole (not illustrated) corresponding to a locking hole (not illustrated) provided by the electronic device main body 10; wherein one end of the fixing component 30 penetrates the first through hole and is screw locked to the locking hole, and another end of the fixing component 30 is wedged at the outer edge of the first through hole to fixedly join the circuit board body 20 to a surface of the electronic device main body 10. In the embodiment of the present invention, the fixing component 30 is a screw, wherein at one end thereof a screw nut is provided to wedge at the outer edge of the first through hole to limit the position of the circuit board body 20.

The electronic device main body 10 comprises a fixing part 11 and the circuit board body 20 comprises a stuck part 21 corresponding to the fixing part. And in the embodiment, the stuck part 21 is disposed along the edge of the circuit board body 20 and recesses inwards into the circuit board body 20 to form a U shape.

Figure 3:
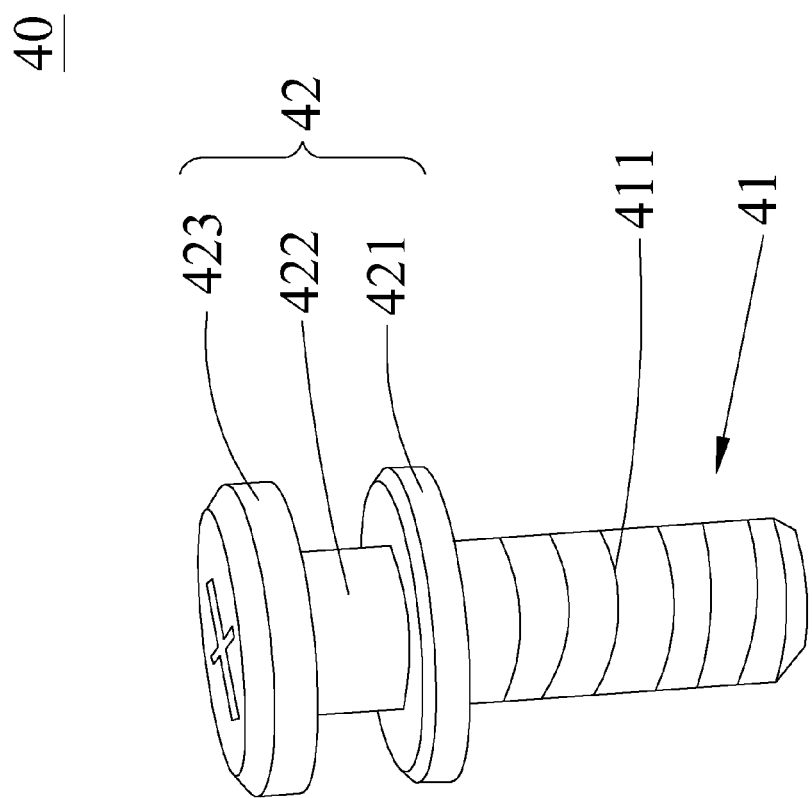
FIG. 3 is a schematic representation illustrating the adjusting component of the height adjustment structure of printed circuit board according to the present invention.

Please refer to FIGS. 2 and 3, wherein FIG. 3 is a schematic representation illustrating the adjusting component of the height adjustment structure of printed circuit board according to the present invention. The adjusting component 40 comprises a locking component 41 and a position limiting part 42. The locking component 41 is a cylinder with threads 411 externally disposed thereon. The position limiting part 42 is disposed at one side of the locking component 41 and comprises a first position limiting component 421, a retaining component 422 and a second position limiting component 423. One surface of the first position limiting component 421 is connected to one end of the locking component 41; and one end of the retaining component 422 is fixedly joined to the other surface of the first position limiting component 421 opposite to the locking component 41. The retaining component 422 is a cylinder and is arranged in a coaxial disposition with the locking component 41. The second position limiting component 423 is disposed at the other end of the retaining component 422 and corresponds to the first position limiting component 421.

In the embodiment of the present invention, the first position limiting component 421 and the second position limiting component 423 are both of board shape and have external diameter larger than the internal diameter of the stuck part 21. Further, the external diameter of the retaining component 422 is designed to be smaller than the internal diameter of the stuck part 21. This arrangement allows the position limiting part 42 to be embedded to the stuck part 21, and the first position limiting component 421 and the second position limiting component 423 to be located on the circuit board body 20 adjacent to the upper and lower surface at the edge of the stuck part 21 respectively. Moreover, the fixing part 11 comprises a second through hole (not illustrated). The locking component 41 penetrates the second through hole and is screw locked thereon to allow the threads 411 to be embedded to the inner wall of the second through hole. The first position limiting component 421 and the second position limiting component 423 drive an end of the circuit board body 20 that is disposed of the position limiting part 42 to bend along a direction corresponding to the screw lock direction of the locking component 41.

Figure 4:
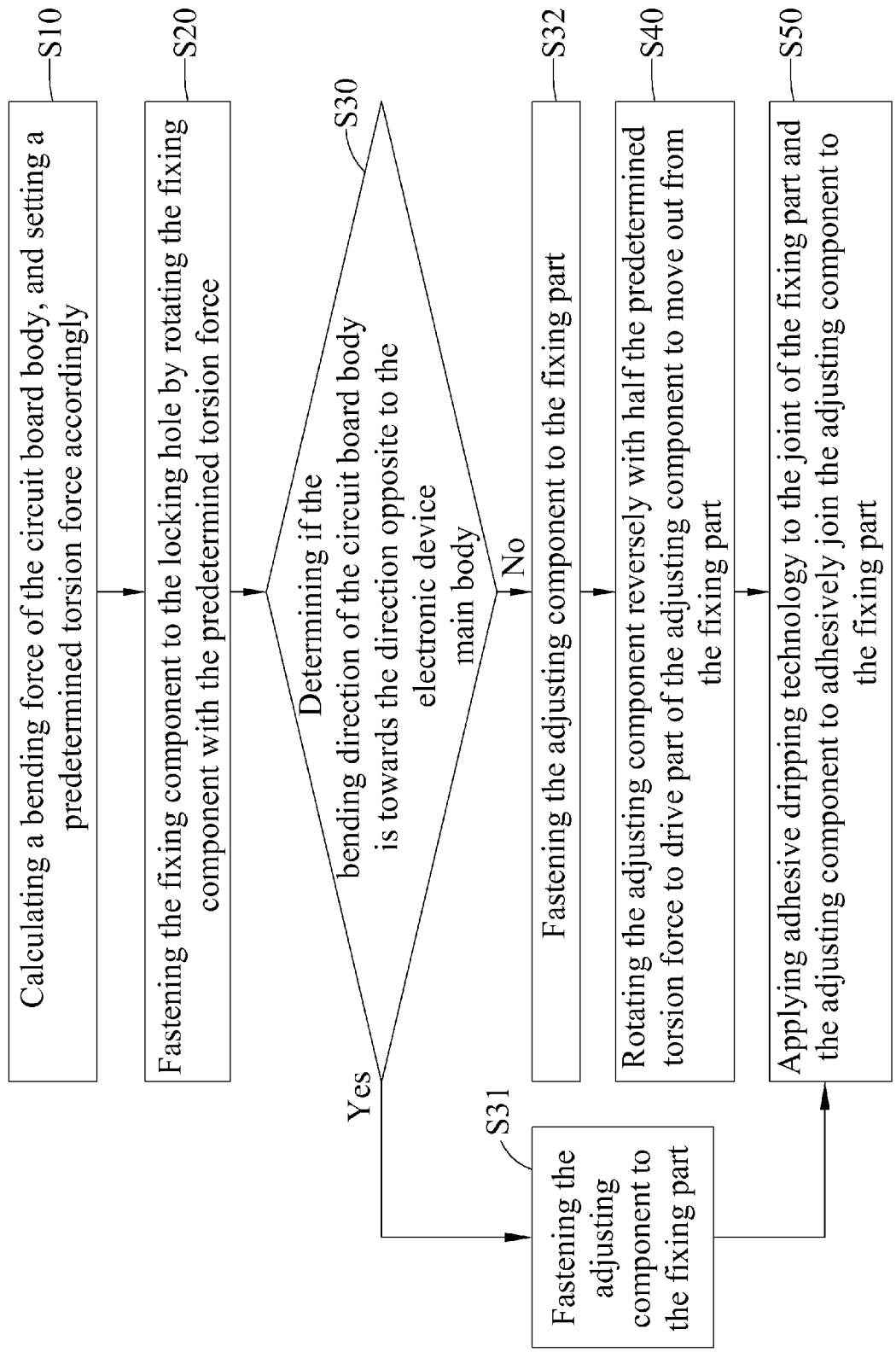
FIG. 4 is a flow char of the printed circuit board height adjustment method according to the present invention.

With reference to FIG. 4, which is a flow char of the printed circuit board height adjustment method according to the present invention and the printed circuit board height adjustment method comprises steps of:

S10: calculating a bending force of the circuit board body, and setting a predetermined torsion force accordingly;

S20: fastening one end of the fixing component to the first through hole by rotating the fixing component with the predetermined torsion force;

S30: determining if the bending direction of the circuit board body is towards the direction opposite to the electronic device main body, and if yes, performing the step of S31; and if no, performing the step of S32;

S31: fastening the adjusting component to the fixing part and then performing the step of S50;

S32: fastening the adjusting component to the fixing part and then performing the step of S40;

S40: rotating the adjusting component reversely with half the predetermined torsion force to drive part of the adjusting component to move out from the fixing part; and S50: applying adhesive dripping technology to the joint of the fixing part and the adjusting component to adhesively join the adjusting component to the fixing part.

Figure 5:
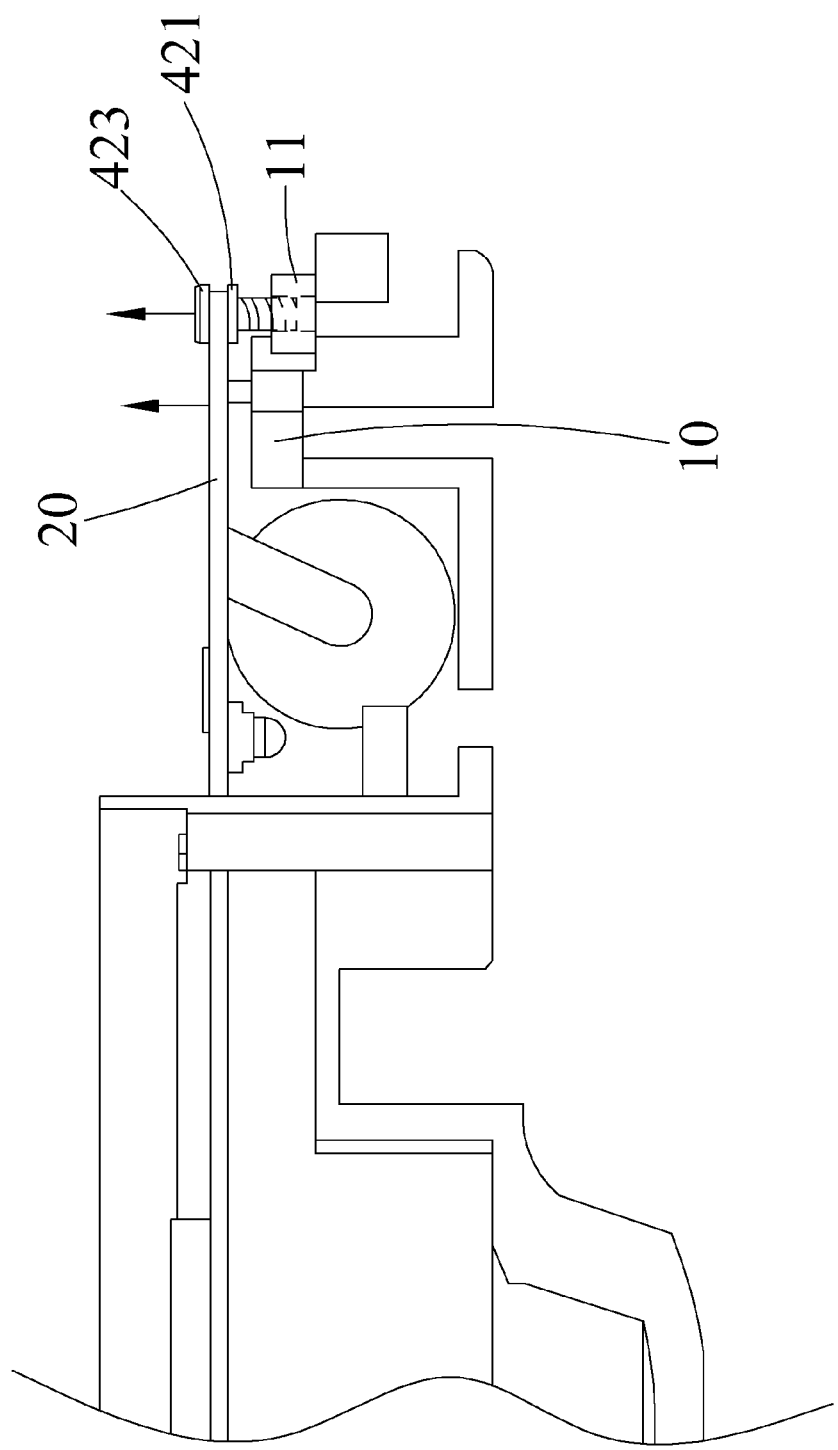
FIG. 5 is a first schematic representation illustrating the adjusting component actuation of the printed circuit board height adjustment method according to the present invention.
Figure 6:
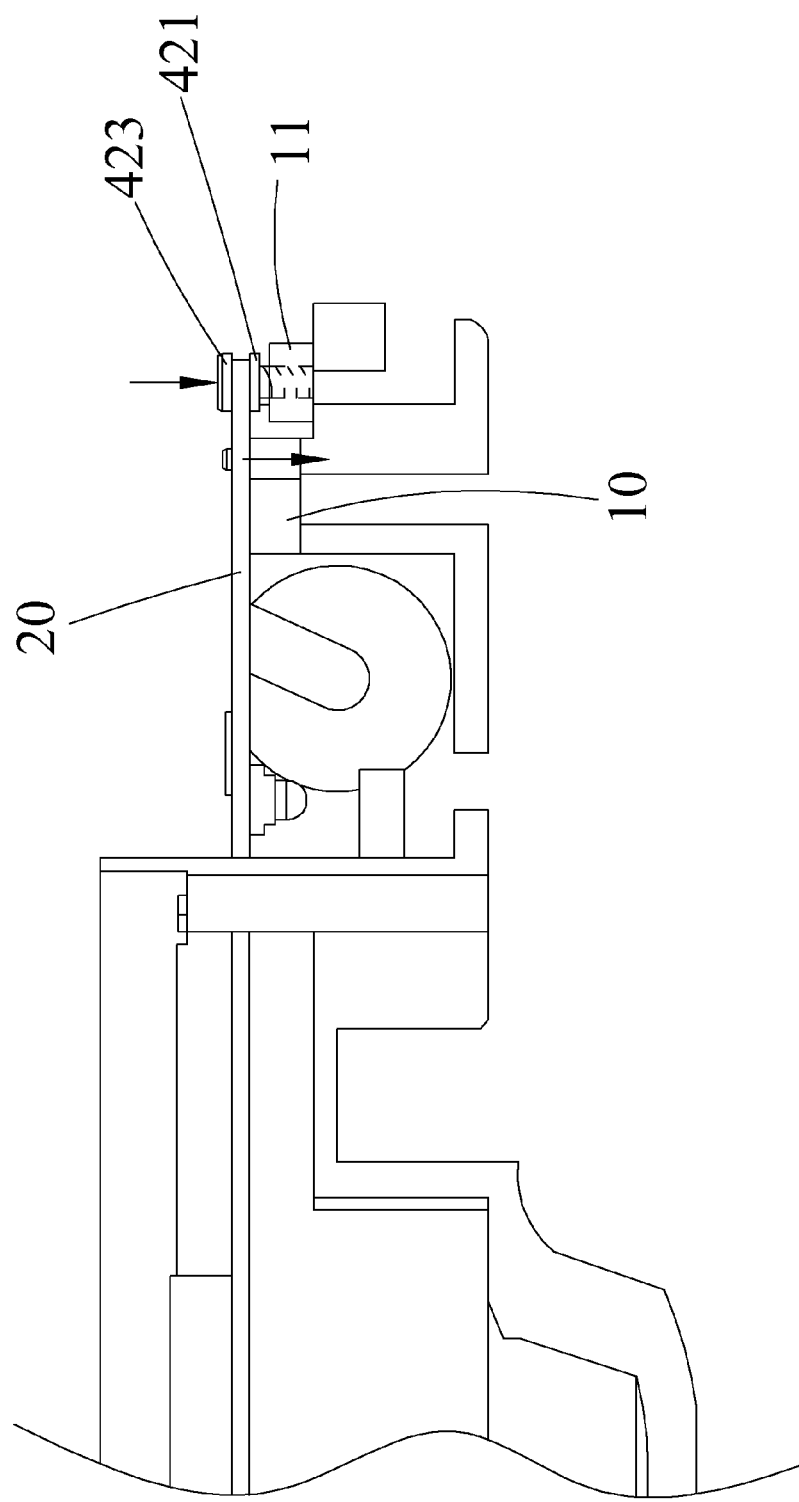
FIG. 6 is a second schematic representation illustrating the adjusting component actuation of the printed circuit board height adjustment method according to the present invention.

With reference to FIG. 2 and FIGS. 4-6, wherein FIG. 5 and FIG. 6 are respectively a first schematic representation and a second schematic representation illustrating the adjusting component actuation of the printed circuit board height adjustment method according to the present invention. The electronic device main body 10 and the circuit board body 20 illustrated in FIG. 2 are fixed and adjusted with the flow process shown in FIG. 4; wherein the position limiting part 42 is embedded to the stuck part 21, allowing the first position limiting component 421 and the second position limiting component 423 to be located on the circuit board body 20 adjacent to the upper and lower surface at the edge of the stuck part 21 respectively. Further, the first position limiting component 421 and the second position limiting component 423 drives an end of the circuit board body 20 that is disposed of the position limiting part 42 to bend along a direction corresponding to the screw lock direction of the locking component 41.

One end of the circuit board body 20 is fixedly joined to the electronic device main body 10 by the fixing component 30; and when the circuit board body 20 bends towards the direction of the electronic device main body 10, the circuit board body 20 could be driven to move out of the fixing part 11 by rotating the adjusting component 40. The end of the circuit board body 20 corresponding to the adjusting component 40 is limited by the first position limiting component 421 and therefore being pressed to bend towards the opposite direction to the fixing part 11 as the circuit board body 20 be moved out of the adjusting component 40, as illustrated in FIG. 5, to compensate the bending force thereof.

One end of the circuit board body 20 is joined to the electronic device main body 10 by the fixing component 30; and when the circuit board body 20 bends towards the direction opposite to the electronic device main body 10, the circuit board body 20 could be driven to move towards the fixing part 11 by rotating the adjusting component 40. The end of the circuit board body 20 corresponding to the adjusting component 40 is limited by the second position limiting component 423 and therefore being pressed to bend towards the fixing part 11 as the circuit board body 20 be moved out of the adjusting component 40—as illustrated in FIG. 6, to compensate the bending force thereof.

By the foregoing arrangement, when performing the step S30 illustrated in FIG. 4, the bending force of the circuit board body 20 can be compensated by adjusting the relative position between the adjusting component 40 and the fixing part 11. This prevents the printed circuit board from warping during assembling and maintains the solder strength thereon. Further, in the embodiment of the present invention, the locking degree of the circuit board body 20 relative to the electronic device main body 10 caused by the predetermined torsion force is smaller than the bearable bending force of the circuit board body 20 such that the circuit board body 20 is prevented from being over bent and damaged.

While particular embodiments of the present invention have been shown and described, it will be obvious to those skilled in the art that, based upon the teachings herein, changes and modifications may be made without departing from this invention and its broader aspects. Therefore, the appended claims are intended to encompass within their scope of all such changes and modifications as are within the true spirit and scope of the exemplary embodiment(s) of the present invention.

What is claimed is:

1. A height adjustment structure of a printed circuit board for adjusting the relative height of the printed circuit board to an electronic device to prevent board warpage thereon, the height adjustment structure of printed circuit board comprising:
    an electronic device main body comprising at least one fixing part;
    a circuit board body disposed on a surface of the electronic device main body at which the fixing part is located, and comprising:
        at least one stuck part disposed along the edge of the circuit board body and corresponding to the fixing part, wherein the stuck part recesses inwards into the circuit board body to form a U shape; and
        an adjusting component, wherein one end of the adjusting component movably penetrates the fixing part and is screw locked thereon, and another end thereof is embedded to the stuck part.

2. The height adjustment structure of printed circuit board as defined in claim 1, wherein the circuit board body further comprises at least one first through hole, and the electronic device main body has at least one locking hole corresponding to the first through hole thereof; one end of a fixing component is wedged at outer edge of the first through hole, and another end of the fixing component penetrates the first through hole and is screw locked to the locking hole to fixedly join the circuit board body to the electronic device main body.

3. The height adjustment structure of printed circuit board as defined in claim 2, wherein the adjusting component comprises:
   a locking component having a cylinder shape and threads externally disposed thereon; and
   a position limiting part disposed at one end of the locking component, and comprising:
      a first position limiting component, wherein one surface of the first position limiting component is connected to one end of the locking component;
      a retaining component having a cylinder shape, wherein one end of the retaining component is fixedly joined to the surface of the first position limiting component opposite to the locking component, and the retaining component is arranged in a coaxial disposition with the locking component, wherein the external diameter of the retaining component is equal to or smaller than the internal diameter of the stuck part to allow the retaining component to lodge in the stuck part; and
      a second position limiting component disposed at the other end of the retaining component and corresponding to the first position limiting component.

4. The height adjustment structure of printed circuit board as defined in claim 3, wherein the first position limiting component and the second position limiting component are both of board shape and have external diameter larger than the internal diameter of the stuck part; as the position limiting part of the adjusting component is embedded to the stuck part, the first position limiting component and the second position limiting component are located on the circuit board body adjacent to the upper and lower surface at the edge of the stuck part respectively.

5. The height adjustment structure of printed circuit board as defined in claim 4, wherein the fixing part comprises a second through hole and the locking component penetrates the second through hole and being screw locked thereon to allow the threads to be embedded to the inner wall of the second through hole; as the locking component is screw locked to the second through hole, the adjusting component drives an end of the circuit board body having the position limiting part to bend in a direction corresponding to the screw lock direction of the locking component.

6. A printed circuit board height adjustment method for the height adjustment structure of printed circuit board as defined in claim 2, wherein the printed circuit board height adjustment method comprises steps of:
   calculating a bending force of the circuit board body, and setting a predetermined torsion force according to the bending force;
   fastening one end of the fixing component to the first through hole by rotating the fixing component with the predetermined torsion force;
   determining if the bending direction of the circuit board body is towards the direction opposite to the electronic device main body, and if yes, fastening the adjusting component to the fixing part; and
   applying adhesive dripping technology to the joint of the fixing part and the adjusting component to adhesively join the adjusting component to the fixing part.

7. The printed circuit board height adjustment method as defined in claim 6, wherein within the step of determining if the bending direction of the circuit board body is towards the direction opposite to the electronic device main body, when the determined result is no, fastening the adjusting component to the fixing part and then reversely rotating the adjusting component with half the predetermined torsion force to drive part of the adjusting component to move out from the fixing part; and then perform adhesive dripping to the joint of the fixing part and the adjusting component to adhesively join the adjusting component to the fixing part.

8. The printed circuit board height adjustment method as defined in claim 7, wherein the adjusting component comprises:
   a locking component having a cylinder shape and threads externally disposed thereon; and
   a position limiting part disposed at one end of the locking component, and comprising:
      a first position limiting component, wherein one surface of the first position limiting component is connected to one end of the locking component;
      a retaining component having a cylinder shape, wherein one end of the retaining component is fixedly joined to the surface of the first position limiting component opposite to the locking component, and the retaining component is arranged in a coaxial disposition with the locking component, wherein the external diameter of the retaining component is equal to or smaller than the internal diameter of the stuck part to allow the retaining component to lodge in the stuck part; and
      a second position limiting component disposed at the other end of the retaining component and corresponding to the first position limiting component.

9. The printed circuit board height adjustment method as defined in claim 8, wherein the first position limiting component and the second position limiting component are both of board shape and have external diameter larger than the internal diameter of the stuck part; as the position limiting part of the adjusting component is being embedded to the stuck part, the first position limiting component and the second position limiting component are thereby located on the circuit board body adjacent to the upper and lower surface at the edge of the stuck part respectively.

10. The printed circuit board height adjustment method as defined in claim 9, wherein the fixing part comprises a second through hole and the locking component penetrates the second through hole and is screw locked thereon to allow the threads to be embedded to the inner wall of the second through hole; as the locking component is screw locked to the second through hole, the adjusting component drives an end of the circuit board body having the position limiting part to move along towards the direction corresponding to the screw lock direction of the locking component.

\* \* \* \* \*